(12) United States Patent
Cao et al.

(10) Patent No.: US 6,909,762 B2
(45) Date of Patent: Jun. 21, 2005

(54) PHASE-LOCKED LOOP CIRCUIT

(75) Inventors: Jun Cao, Irvine, CA (US); Afshin Momtaz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/843,181

(22) Filed: May 11, 2004

(65) Prior Publication Data

US 2004/0208273 A1 Oct. 21, 2004

Related U.S. Application Data

(63) Continuation of application No. 09/632,665, filed on Aug. 7, 2000, now Pat. No. 6,760,394.
(60) Provisional application No. 60/148,415, filed on Aug. 11, 1999.

(51) Int. Cl.[7] .................................................. H03D 3/24
(52) U.S. Cl. ...................... 375/376; 327/156; 327/159; 331/DIG. 2
(58) Field of Search ................................. 375/374, 376, 375/354, 371, 373; 331/DIG. 2, 25; 327/1, 141, 147, 151, 156, 159, 339

(56) References Cited

U.S. PATENT DOCUMENTS

| | | | |
|---|---|---|---|
| 5,327,103 A | | 7/1994 | Baron et al. |
| 5,406,592 A | | 4/1995 | Baumert |
| 5,473,639 A | * | 12/1995 | Lee et al. .................... 375/376 |
| 5,483,558 A | * | 1/1996 | Leon et al. .................. 375/376 |
| 5,656,977 A | | 8/1997 | Kelkar et al. |
| 5,799,049 A | | 8/1998 | McFarland et al. |
| 5,870,002 A | * | 2/1999 | Ghaderi et al. ................ 331/17 |
| 5,896,428 A | | 4/1999 | Yanagiuchi |
| 5,905,410 A | | 5/1999 | Holmes et al. |
| 5,943,613 A | | 8/1999 | Wendelrup et al. |
| 6,100,721 A | | 8/2000 | Durec et al. |
| 6,215,834 B1 | * | 4/2001 | McCollough ................ 375/375 |
| 6,222,400 B1 | * | 4/2001 | Fukuda et al. ............... 327/151 |
| 6,259,290 B1 | | 7/2001 | Takada et al. |
| 6,314,150 B1 | | 11/2001 | Vowe |
| 6,320,469 B1 | | 11/2001 | Friedberg et al. |
| 6,353,647 B1 | * | 3/2002 | Wilhelmsson et al. ....... 375/376 |
| 6,803,827 B1 | * | 10/2004 | Kenney et al. ................ 331/16 |

FOREIGN PATENT DOCUMENTS

JP  8-97717 A  4/1996

* cited by examiner

Primary Examiner—Jean B. Corrielus
(74) Attorney, Agent, or Firm—Christie, Parker & Hale, LLP (57) ABSTRACT

Method and circuitry for improving the accuracy and efficiency of a phase-locked loop. More specifically, the present invention relates to a method and device for monitoring the frequency discrepancy between two signals in conjunction with at least one data signal so as to improve the accuracy and efficiency of a phase-locked loop. In one embodiment of the present invention, two counters are used to check the frequency differential between a VCO signal and an external reference or input signal. An adjustable threshold is provided to determine whether the frequencies of the two signals are considered to be in a frequency-locked mode. A pair of flip-flops is used to minimize any erroneous detection of frequency discrepancy by validating two consecutive results of the frequency differential check. In addition, a data present signal is used to control the transition between the phase-locked mode and the frequency-locked mode to minimize the potential data loss.

8 Claims, 6 Drawing Sheets

PHASE-LOCKED LOOP CIRCUIT

CROSS-REFERENCES TO RELATED APPLICATIONS

This application is a continuation of U.S. patent application Ser. No. 09/632,665 filed Aug. 7, 2000 which claims the benefit of priority under 35 U.S.C. § 119 from U.S. Provisional Patent Application Ser. No. 60/148,415 filed on Aug. 11, 1999, and issued as U.S. Pat. No. 6,760,394 on Jul. 6, 2004, the disclosure of which is hereby incorporated by reference in its entirety for all purposes.

BACKGROUND OF THE INVENTION

The present invention relates to improving the accuracy and efficiency of a phase-locked loop. More specifically, the present invention relates to a method and device for monitoring the frequency discrepancy between two signals in conjunction with at least one data signal so as to improve the accuracy and efficiency of a phase-locked loop.

Figure 1:
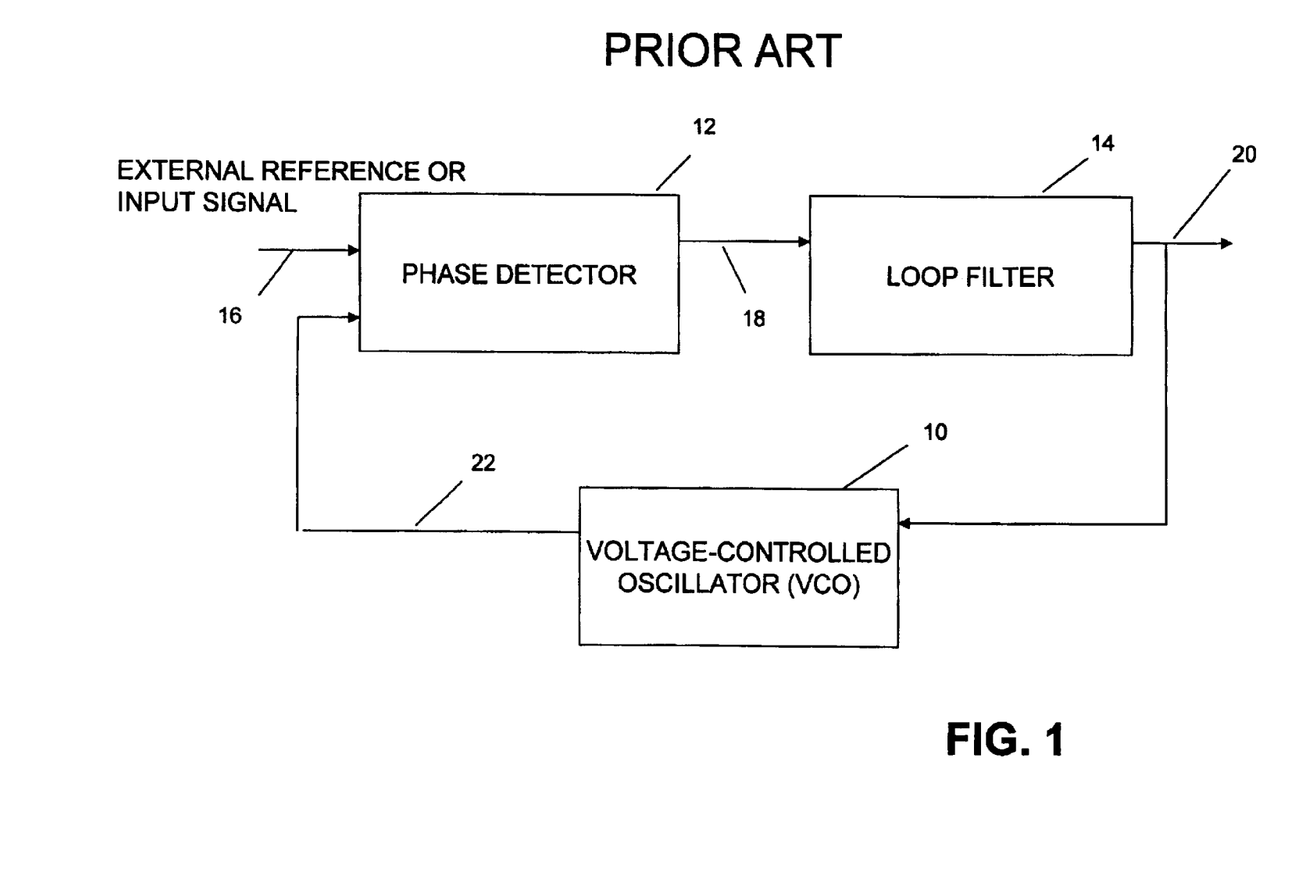
FIG. 1 shows a simplified block diagram of the functional elements of a conventional PLL.

A phase-locked loop (PLL) is a circuit that is capable of synchronizing an output signal generated by an oscillator with a reference or input signal in frequency as well as in phase. FIG. 1 shows a simplified block diagram of the functional elements of a conventional PLL. A conventional PLL generally includes a voltage-controlled oscillator (VCO) 10, a phase detector 12, and a loop filter 14. A PLL uses feedback to maintain an output signal in a specific phase with a reference signal. The VCO 10 generally oscillates at an angular frequency which is determined by the output signal 20 of the loop filter 14 which, in turn, is controlled by the output signal 18 of the phase detector 12. In turn, the output 22 of the VCO 10 and the external reference or input signal 16 dictate the output signal 18 of the phase detector 12. Hence, if the phase error between the VCO output 22 and the external reference or input signal 16 is not zero or within a tolerable margin, the phase detector 12 will develop a nonzero output 18, thereby via the loop filter 14 causing the VCO 10 to produce an output signal 22 that is synchronized or locked with the external reference or input signal 16 and reducing the phase error to an acceptable level.

The process of achieving a lock between the VCO output 22 and the external reference or input signal 16 involves two steps. First, the frequencies of the two signals 16, 22 have to be matched. When the two frequencies are matched, the two signals 16, 22 are sometimes referred to as being in a frequency-locked mode. Once the frequency-locked mode is achieved, the phases of the two signals 16, 22 are then matched thereby achieving a phase-locked mode. In other words, the frequency-locked mode is a prerequisite to achieving the phase-locked mode. Once the phase-locked mode is achieved, the PLL can then perform its intended functions.

PLLs are used in many applications including frequency synthesis, modulation, demodulation, and data and clock recovery. For example, in digital communications, it is frequently necessary to extract a coherent clock signal from an input data stream. A PLL is often used for this task by locking a VCO output to the input data stream. Once locked, the VCO output is essentially the clock signal of the input data stream and thus can then be used to extract the data bits from the input data stream.

Quite often, however, two signals for a variety of reasons may disengage from the phase-locked mode. This can happen when the two signals are no longer in frequency-locked mode. For example, when a data signal becomes jittery or disappears entirely, the frequencies of the data signal and the VCO signal can no longer match, thereby causing the two signals to disengage from the frequency-locked mode and subsequently from the phase-locked mode. Therefore, it would be desirable to provide a method and device that is capable of reliably detecting whether two signals are in frequency-locked mode thereby ensuring that the phase-locked mode is maintained.

In addition, different systems often require different degrees of precision 25 to achieve a frequency-locked mode depending on the purposes of the systems. Some systems may require two signals to be closely matched before a frequency-locked mode is considered achieved, while others may permit a wider margin of matching. Therefore, it would be desirable to provide a method and device that is capable of having an adjustable threshold for determining whether a frequency-locked mode is achieved.

Further, as mentioned above, before a PLL can perform its intended functions, it must be engaged in a phase-locked mode first which, in turn, requires as a prerequisite a frequency-locked mode to be achieved. Conversely, a phase-locked mode is disengaged when the prerequisite frequency-locked mode is no longer present. Any unnecessary or mistaken disengagement of the frequency-locked mode thus disrupts the phase-locked mode and consequently prevents the PLL from performing its intended functions. Therefore, it would be desirable to provide a method and device that is capable of efficiently monitoring the activation of the frequency-locked mode so as to optimize the continued operation of a PLL.

Moreover, very often when a PLL is engaged in a phase-locked mode and no data is available for detection, the VCO signal tends to drift and eventually will no longer be considered to be in frequency-locked mode with the external reference or input signal. During this period when the frequency-locked mode is lost, a PLL is not capable of detecting incoming data and such data are thus lost. When this occurs, the phase-locked mode has to be disengaged so as to allow the frequency-locked mode to be re established so that as soon as data is available, the PLL can switch to the phase-locked mode to capture the data. Therefore, it would be desirable to provide a method and device that is capable of efficiently monitoring and controlling the transition between the phase-locked mode and the frequency-locked mode so as to minimize data loss. The present invention satisfies the above as well as other needs.

SUMMARY OF THE INVENTION

The present invention seeks to efficiently control the transition between the phase-locked mode and the frequency-locked mode during the operation of a PLL. In one embodiment of the present invention, two counters are used to check the frequency differential between a VCO signal and an external reference or input signal. The external reference or input signal and the VCO signal are used to drive the two counters respectively. Both counters conduct count-downs in a cyclic manner. When the first counter arrives at an identifiable position in its count-down, the second counter is directed to begin its count-down from a predetermined position. When the first counter once again reaches the same identifiable position, the output of the second counter is checked to determine the differential between such output and the identifiable position of the first counter. Such differential can be selectively interpreted to provide an adjustable threshold to determine whether the frequencies of the two signals are considered to be in a frequency-locked mode.

The result of the frequency differential check is propagated through a pair of flip-flops. The pair of flip-flops are connected in series. Hence, the pair of flip-flops records the results of any two consecutive frequency differential checks.

The outputs of the two flip-flops are logically combined to a logic element which produces a low signal when both outputs of the flip-flops are high. In one exemplary implementation, a NAND logic function is provided to accept the output signals of the pair of flip-flops. The NAND logic function produces a low signal only when the results of both frequency differential checks are high, meaning that remedial action should be taken to rectify the frequency-locked mode. This provides the advantage that erroneous detection of a frequency discrepancy is minimized. This also provides the advantage that the PLL is given additional time to pull in the locked frequency when the PLL switches from the frequency-locked mode to the phase-locked mode.

In addition, a data present signal is logically combined with the output of the NAND logic function. An AND logic function, for example, produces a high signal only when both the data present signal and the output of the NAND logic function are high, meaning that data are present for detection and there is no frequency discrepancy. This, in turn, signifies that the phase-locked mode should be maintained. This minimizes unnecessary transition between the phase-locked mode and the frequency-locked mode thereby reducing the likelihood of data loss.

Reference to the remaining portions of the specification, including the drawings and claims, will realize other features and advantages of the present invention.

Further features and advantages of the present invention, as well as the structure and operation of various embodiments of the present invention, are described in detail below with respect to accompanying drawings, like reference numbers indicate identical or functionally similar elements.

DESCRIPTION OF THE SPECIFIC EMBODIMENTS

Figure 2:
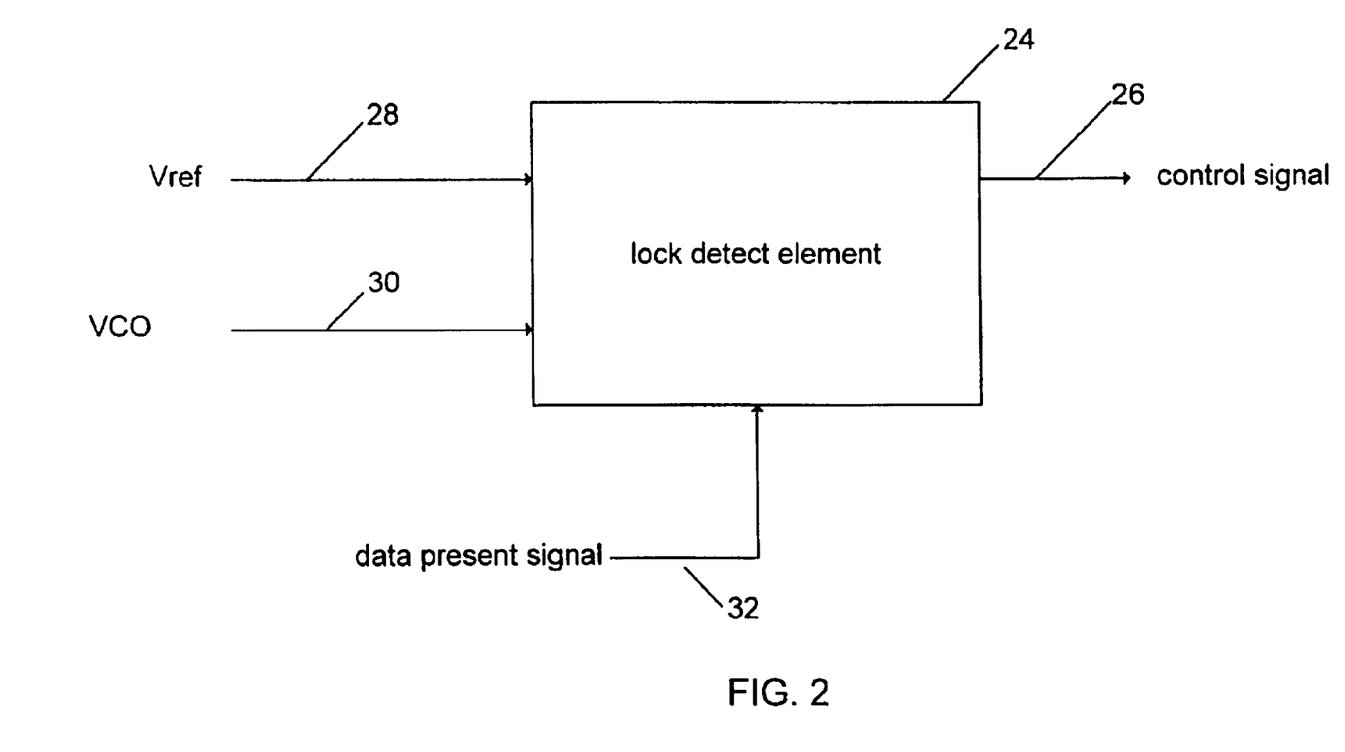
FIG. 2 shows a simplified functional block diagram of one embodiment of the present invention.

The present invention will now be described. FIG. 2 shows a simplified 10 functional block diagram of one embodiment of the present invention. The function of the lock detect element 24 is to produce a control signal 26 to indicate whether the frequency-locked mode or the phase-locked mode should be engaged.

The lock detect element 24 accepts as inputs an external reference clock 15 signal (Vref) 28 and a VCO signal 30. In circuit applications, such as in high frequency fiber optic communication networks, the VCO signal 30 may be in the gigahertz range. In such applications, it is preferable to divide down the frequency of the VCO signal 30 by a certain predetermined factor, for example, 32 or 16, so as to make frequency matching with Vref 28 more manageable. The frequencies of Vref 28 and the VCO signal 30 are designated respectively as fref and fvco.

The lock detect element 24 then compares fref and fvco to determine if the frequency differential between them is within an adjustable predetermined threshold. Such adjustable predetermined threshold is dependent on the requirements of the system which uses the PLL. If the frequency differential is within the adjustable predetermined threshold, then the phase-locked mode is maintained; otherwise, certain mechanism may be triggered to engage the Vref 28 and the VCO signal 30 into the frequency-locked mode. Details with respect to detecting the difference between fref and fvco will be more fully described below.

Figure 3:
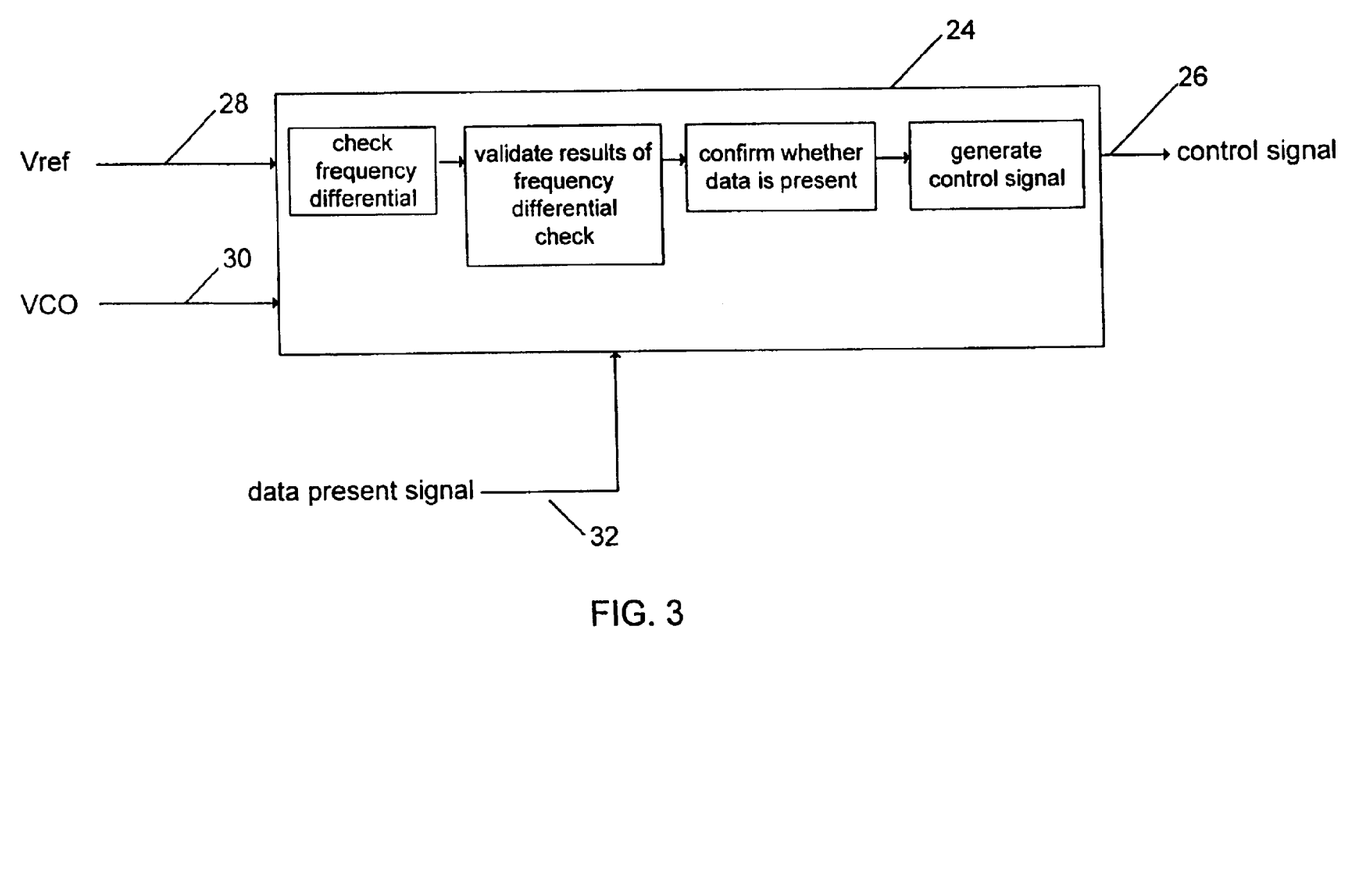
FIG. 3 is a simplified functional block diagram showing the functional components of one embodiment of the present invention.

FIG. 3 is a simplified functional block diagram showing the functional components of the lock detect element 24 in accordance with the present invention. The lock detect element 24 generally performs four basic functions 34, 36, 38 and 40, namely, checking the frequency differential of the Vref 28 and the VCO signal 30, validating the results of the frequency differential check, confirming whether data is present, and generating the appropriate control signal 26 to control the transition between the phase-locked mode and the frequency-locked mode.

Figure 4:
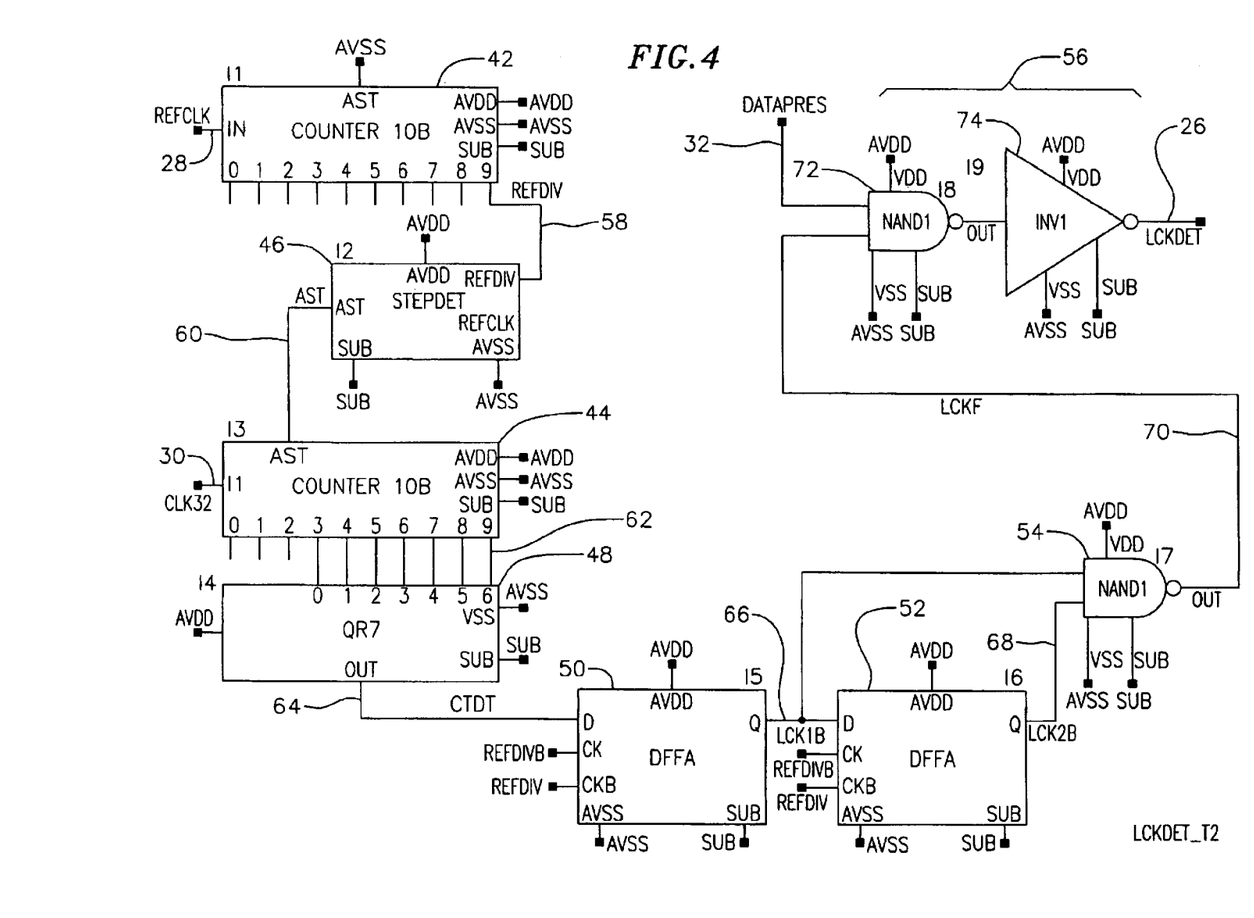
FIG. 4 is a simplified schematic block diagram showing one embodiment of the present invention.

FIG. 4 is a simplified schematic block diagram showing one exemplary embodiment of the present invention. This embodiment includes two digital counters 42, 44, a step detector 46, a bits checker 48, two flip-flops 50, 52, a NAND logic function 54, and an AND logic function 56.

A first counter 42 feeds the most significant bit (MSB) 58 of its output to a step detector 46. The output 60 of the step detector 46 is connected to the second counter 44. Selected output bits 62 of the second counter 44 are then fed into a bits checker 48.

As will be explained below, the use of these selected output bits 62 provides the ability to control the amount of adjustable threshold to be used to determine whether Vref 28 and the VCO signal 30 are in a frequency-locked mode. The output 64 of the bits checker 48 is connected to a first flip-flop 50. The output 66 of the first flip-flop 50 is entered into a second flip-flop 52. The outputs 66, 68 of both flip-flops 50, 52 are accepted as inputs by a NAND logic function 54. The result 70 of the NAND logic function 54 together with a data present signal 32 are then fed into an AND logic function 56 to produce a control signal 26. The significance of the data present signal 32 will be more fully explained below.

The operation of the embodiment of the present invention as shown in FIG. 4 will now be described. The signal Vref 28 is fed into the first counter 42 to initiate a count-down. The first counter 42 performs the count-down in a cyclic manner. In other words, the first counter 42 counts down to zero and then repeats the count-down from the largest number that it can handle. The count-down can start with an arbitrary number and the speed of the first counter 42 is controlled by the frequency of Vref 28 which is fref.

During the count-down, the output bits of the first counter 42 change with the clock 30 signal, i.e., Vref 28, to generate the count.

As previously noted, the output MSB 58 of the first counter 42 is connected to the input of the step detector 46. The function of the step detector 38 is to detect a rising step change in its input, i.e., the output MSB 58. A rising step change means a change from a low ("0") to a high ("1"). There is only one instance during the count-down when the output MSB 58 of the first counter 42 changes from a low to a high. That instance occurs when the first counter 42 reaches zero and restarts the count-down at the largest possible number. For example, for a 4-bit counter, the transition is from "0000" to "1111". This is the point where the precise value of the first counter 42 is known when only the output MSB 58 is monitored. Monitoring other output bits of the first counter 42 individually does not allow the value of the first counter 42 to be determined precisely because these other bits can go from a low to a high in many instances during the count-down. By having the output MSB 58 of the first counter 42 connected to the input of the step detector 46, the transition from the smallest number to the largest number during the count-down can be detected by the step detector. By being able to pinpoint this particular transition, a reliable starting point can be established to test the frequency differential between fref and fvco. Upon detecting the rising step change due to the output MSB 58 of the first counter 42, the step detector 46 signals to a second counter 44 to initiate a count-down by the second counter 44.

Figure 5:
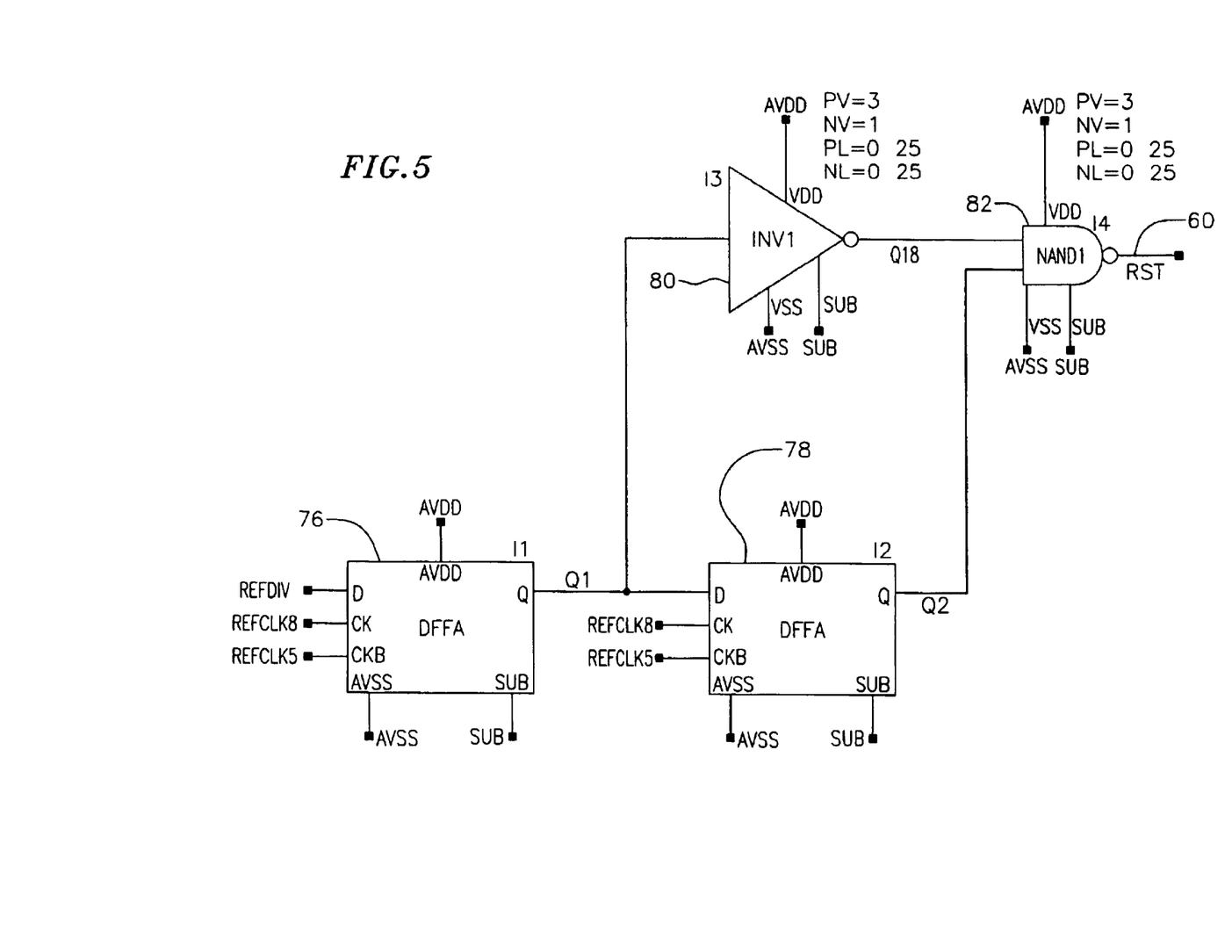
FIG. 5 is a logic circuit diagram illustrating one particular component of one embodiment of the present invention.

FIG. 5 shows a logic circuit which can be used to implement the step detector 46. This logic circuit can be used in conjunction with the first counter 42 which performs a count-down function. In this embodiment, the step detector 46 includes a pair of flip-flops 76, 78, an inverter 80, and a NOR logic function 82. The two flip-flops 76, 78 are connected in series. The input to the flip-flop 76 is the output MSB 58 of the first counter 42. One output of the flip-flop 76 is coupled to the inverter 80. The output of the inverter 80 and the output of the flip-flop 78 are then combined as inputs to the NOR logic function 82. The output of the NOR logic function 82 is the output 60 of the step detector 46. The operation of the step detector 46 as implemented by this logic circuit is straightforward. It can be easily seen that the only instance when the output of the NOR logic function 82 is high is when the output of the flip-flop 76 is high and the output of the flip-flop 78 is a low, meaning that the output MSB 58 of the first counter 42 has transitioned from a "0" to a "1".

Prior to receiving the count-down initiation signal 60 from the step detector 46, the second counter 44 is held in reset. When the count-down initiation signal 60 is received from the step detector 46, the second counter 44 similarly begins a count down sequence beginning from a predetermined number set by the system designer. This predetermined number is related to the adjustable threshold and its significance will be explained below. The speed of the second counter 44 is driven by the VCO signal 30 whose frequency is fvco.

At the moment that the second counter 44 is instructed to start counting, the value of the first counter 42 is known. As mentioned above, in order to start the second counter 44, the step detector 46 must have detected a rising step change from the output MSB 58 of the first counter 42 which, in turn, means that the first counter 42 is about to turn over its count-down sequence and begin from the largest possible number again. By starting the second counter 44 at that point, the frequency differential between fref and fvco can be determined because the precise starting points of the two counters 42, 44 are known.

After the second counter 44 initiates its count-down, the first counter 42 continues its own count-down. When the first counter 42 completes one count-down cycle (i.e., when the step detector 46 detects another rising step change from the output MSB 58 of the first counter 42), the output bits 62 of the second counter 44 are checked by the bits checker 48 to determine where the second counter 44 is in its count-down cycle. At that moment, the first counter 42 is known to be at its smallest possible number, i.e., "0", so the output bits 62 of the second counter 44 are checked to see if they represent a "0" as well. The bits checker 48 can be implemented using, for example, an OR logic function to perform this check. Hence, by examining the second counter 44 at that point, it can be determined how far apart the two frequencies, fref and fvco, are.

It should be noted that the check performed by the bits checker 48 is affected by the initial predetermined number from which the count-down of the second counter 44 begins. The result 64 of the bits checker 48 has to be adjusted accordingly based on the difference between the initial predetermined number of the second counter 44 and the initial count-down number of the first counter 42 (which is usually "0") when the count-down of the second counter 44 begins.

It should be further understood that the frequency differential check can be similarly performed using counters which count up in a cyclic manner and a step detector which detects a transition from a "1" to a "0". In fact, any combination of logic elements can be used as long as an identifiable position can be repeatedly ascertained during count cycles.

The number of output bits 62 of the second counter 44 that need to be examined depends on the desired amount of threshold within which the frequency differential of fref and fvco must fall if fref and fvco are to be considered in a frequency-locked mode. If a very precise threshold is required, more output bits, or perhaps the entire output of the second counter, may need to be checked. If a more lenient threshold is permitted, then only the more significant output bits may need to be examined and the less significant output bits can be ignored. Hence, by selectively examining the number of output bits 62 of the second counter 44, an adjustable threshold can be implemented depending on the desired precision of the frequency-locked mode.

The result 64 produced by the bits checker 48 is then recorded by the first flip-flop 50. For example, if all the examined output bits 62 of the second counter 44 are "0's", then a result of "0" is produced by the bits checker 48. This indicates that the two frequencies, fref and fvco, are within the allowable threshold and thus in frequency-locked mode. Otherwise, a "1" is produced indicating a frequency discrepancy. On the next rising step change of the output MSB 58 of the first counter 42, the result 66 of the first flip-flop 50 is passed onto the second flip-flop 52 and a new result 64 from the bits checker 48 is passed into the first flip-flop 50. The outputs 66, 68 of the two flip-flops 50, 52 are fed into the NAND logic function 54.

The combination of the two flip-flops 50, 52 and the NAND logic function 54 provides protection against erroneous detection of frequency discrepancy and thus prevent the unnecessary initiation of measures to put the two frequencies, fref and fvco, back into frequency-locked mode. For example, erroneous detection of frequency discrepancy can occur when a noise burst corrupts the result 64 produced by the bits checker 48.

By connecting the two flip-flops 50, 52 in series, two consecutive results of the frequency differential checks performed by the bits checker 48 are maintained. The NAND logic function 54 interprets these two consecutive results 66, 68 and produces a signal 70 to initiate steps to rectify the frequency-locked mode only when both results 66, 68 indicate that there is a frequency discrepancy. For example, if one of the two consecutive results 66, 68 from the bits checker 48 is a "0" indicating that there is a frequency match, then the NAND logic function 54 by its nature of operation will produce a high signal, i.e., a "1". The only time the NAND logic function 54 produces a low signal or a "0" is when both its inputs 66, 68 are high or "1's". Hence, in order for the NAND logic function 54 to generate a low signal, both consecutive results 66, 68 from the bits checker 48 have to be high indicating a frequency discrepancy in both instances. The foregoing provides an advantage in preventing the system from engaging in any premature corrective measures when only one instance of frequency discrepancy exists. It should be further understood that to provide for increased accuracy in detecting frequency discrepancy, additional flip-flops may be used to record the history of the frequency differential check.

The output 70 of the NAND logic function 54 and the data present signal 32 are then fed into an AND logic function 56 to produce either a high signal indicating that the phase-locked mode should be maintained or a low signal indicating that the frequency-locked mode should be engaged. In one embodiment, the AND logic function 56 is implemented by using a NAND logic function 72 connected in series with an inverter 74. The operation of the AND logic function 56 produces a high control signal 26 only when both inputs 32, 70 are also high; in all other instances, the control signal 26 is low. Hence, the AND logic function 56 produces the high control signal 26 only when both the data present signal 32 is high indicating the presence of data and the output 70 of the NAND logic function 54 is high indicating that there is no frequency discrepancy. In all other cases, such as when the data present signal 32 is low indicating that no data is available, or the output 70 of the NAND logic function 54 is low indicating that there is a frequency discrepancy, or both, the control signal 26 produced by the AND logic function 56 remains low. A low control signal 26 generated by the AND logic function 56 signifies that the frequency-locked mode should be engaged.

The use of the data present signal 32 provides an additional measure of protection against undertaking premature actions to engage the phase-locked mode. As mentioned above, a PLL is often used to ascertain the proper clock signal frequency in order to retrieve data from an input data stream. When data is not present, the frequency locked mode should be maintained and kept ready for retrieval of data. On the other hand, when data is present and there is no frequency discrepancy, then the phase-locked mode should be maintained to continue to retrieve data. By using the data present signal 32 as one of the inputs to the AND logic function 56, the phase-locked mode is not automatically engaged upon the determination that there is no frequency discrepancy between fref and fvco. This is significant because when the phase-locked mode is engaged with no data present, fvco will drift and eventually will no longer match fref. fref and fvco then have to be restored to the frequency-locked mode. Consequently, any data that comes in during this restoring period will be undetected and lost. In contrast to the situation where the frequency-locked mode is maintained and kept ready, when data becomes available, the phase-locked mode can be promptly engaged to capture the data. Hence, with the use of the data present signal 32, unnecessary transition between the phase-locked mode and the frequency-locked mode is minimized thereby reducing the likelihood of losing data.

Figure 6:
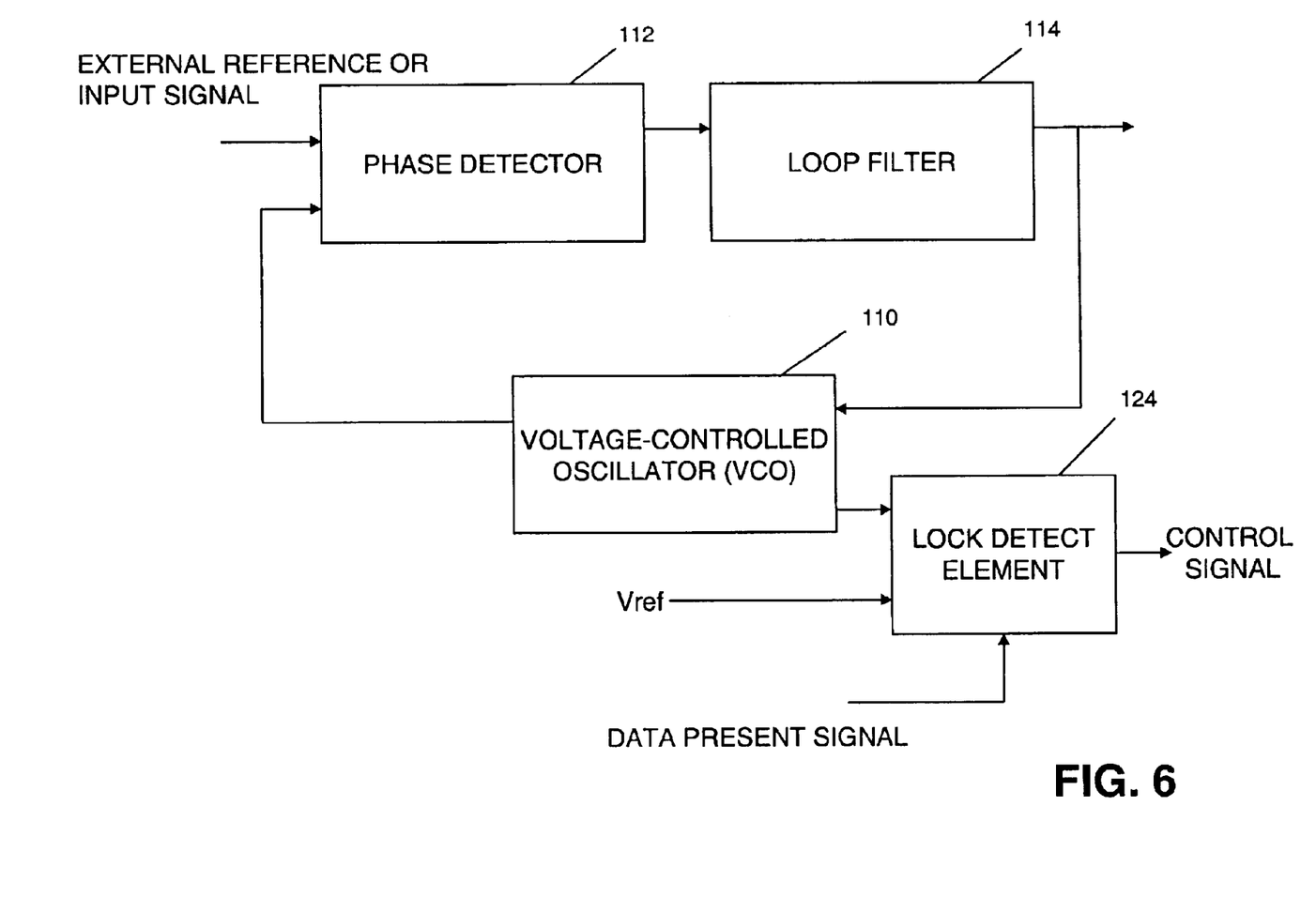
FIG. 6 shows a simplified block diagram of the functional elements of a PLL in an exemplary embodiment according to the present invention.

As shown in FIG. 6, a PLL according to an exemplary embodiment of the present invention includes a VCO 110, a phase detector 112, a loop filter 114 and a lock detect element 124. The lock detect element 124 can be substantially the same as the It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A phase-locked loop circuit comprising:

a voltage-controlled oscillator providing a voltage-controlled oscillator output signal;

a loop filter providing a phase-locked loop circuit output signal which is fed back to provide a voltage-controlled oscillator input signal;

a phase detector responsive to a reference input signal and the voltage-controlled oscillator output signal and providing an input signal to the loop filter; and a lock detector responsive to the voltage-controlled oscillator output signal, the reference input signal and a data present signal for producing a control signal to control a transition between a phase-locked mode and a frequency-locked mode for the phase-locked loop circuit, the lock detector comparing the reference input signal and the voltage-controlled oscillator output signal to determine if a frequency differential between the reference input signal and the voltage-controlled oscillator output signal is within an adjustable predetermined threshold, the control signal:

maintaining the phase-locked mode if the data present signal is indicative of data being present and the frequency differential is within the adjustable predetermined threshold; and maintaining the frequency locked mode if the data present signal is indicative of data not being present or if the frequency differential is not within the adjustable predetermined threshold.

2. The phase-locked loop circuit of claim 1 wherein the lock detector includes:

a first counter configured to generate a first binary count, the first counter being driven by the reference input signal;

a second counter having a reset input coupled to one output bit of the first binary count, the second counter being driven by the voltage-controlled oscillator output signal and configured to generate a second binary count on a plurality of output terminals; and a logic circuit having a plurality of inputs coupled to a selected number of the plurality of output terminals of the second counter;

wherein an output of the logic circuit signals a frequency lock condition between a frequency of the reference input signal and a frequency of the voltage-controlled oscillator signal.

3. The phase-locked loop circuit of claim 2, wherein the frequency lock condition is represented by a range that is adjustable based on the selected number of the plurality of output terminals of the second counter.

4. The phase-locked loop circuit of claim 2, wherein the one output bit is the most significant bit (MSB) of the first binary count, and wherein the MSB is coupled to the reset input of the second counter via a transition detect circuit.

5. The phase-locked loop circuit of claim 4, wherein the transition detect circuit detects a change of the MSB of the first binary count from a first binary state to a second binary state.

6. The phase-locked loop circuit of claim 5, wherein the transition detect circuit includes:
- a first flip-flop coupled to receive the MSB at an input;
- a second flip-flop coupled to an output of the first flip-flop;
- a logic element coupled to logically combine an output of the first flip-flop with an output of the second flip-flop, the logic element having an output coupled to the reset input of the second counter.

7. The phase-locked loop circuit of claim 2, further comprising a frequency differential validation circuit coupled to the output of the logic circuit and configured to detect at least two consecutive frequency lock conditions.

8. The phase-locked loop circuit of claim 7, further comprising a data confirmation circuit coupled to an output of the frequency differential validation circuit and the data present signal.

* * * * *